US005783861A

United States Patent [19]

Son

[11] Patent Number: 5,783,861
[45] Date of Patent: Jul. 21, 1998

[54] SEMICONDUCTOR PACKAGE AND LEAD FRAME

[75] Inventor: Deog Soo Son, Daegu-si, Rep. of Korea

[73] Assignee: LG Semicon Co., Ltd., Chungcheongbuk-do, Rep. of Korea

[21] Appl. No.: 812,919

[22] Filed: Mar. 10, 1997

Related U.S. Application Data

[63] Continuation of Ser. No. 407,070, Mar. 20, 1995, abandoned.

[30] Foreign Application Priority Data

Mar. 29, 1994 [KR] Rep. of Korea ............. 1994/6391

[51] Int. Cl.⁶ ............................................ H01L 25/48
[52] U.S. Cl. ...................... 253/693; 257/694; 257/787; 257/698; 257/666
[58] Field of Search ........................... 257/696, 697, 257/693, 666, 694, 787, 698

[56] References Cited

U.S. PATENT DOCUMENTS

| 4,677,526 | 6/1987 | Muehling | 257/697 |
|---|---|---|---|
| 4,873,615 | 10/1989 | Grabbe | 257/696 |
| 4,982,268 | 1/1991 | Schuermann | 257/666 |
| 5,053,852 | 10/1991 | Biswas et al. | 257/696 |
| 5,294,897 | 3/1994 | Notani et al. | 257/676 |
| 5,302,849 | 4/1994 | Cavasin | 257/676 |
| 5,360,992 | 11/1994 | Lowrey et al. | 257/666 |
| 5,381,047 | 1/1995 | Kanno | 257/700 |

FOREIGN PATENT DOCUMENTS

| 62-2560 | 1/1987 | Japan . | |
|---|---|---|---|
| 64-23341 | 6/1987 | Japan . | |
| 53-151058 | 6/1988 | Japan . | |
| 64-23341 | 1/1989 | Japan | 257/697 |

OTHER PUBLICATIONS

Abstract and Figs. 1-3 of U.S. Pat. No. 5,357,139 issued Oct. 18, 1994 to Yaguchi et al, titled "Plastic Encapsulated Semiconductor Device And Lead Frame".

Abstract of Japanese Patent 61-299537 issued Jun. 23, 1988 to Hitoshi Ito, titled "Resin Packaged Type Semiconductor Device".

Abstract of Japanese Patent 60-141178 issued Aug. 1, 1987 to KO ASO, titled "Resin-Sealed Type Semiconductor Device".

Primary Examiner—Mahshid D. Saadat
Assistant Examiner—S. V. Clark

[57] ABSTRACT

A semiconductor package comprises at least one semiconductor chip; a lead frame having a chip paddle supporting a semiconductor chip, a plurality of inner leads wire-bonded to the chip and a plurality of outer lead extended from the inner leads; and a plastic molding compound sealing the chip and the inner lead of the lead frame, wherein the outer leads of the lead frame being arranged within an area of a bottom surface of the plastic molding compound.

A lead frame for use in the semiconductor package comprises a plurality of inner leads to be connected respectively to pads of a semiconductor chip; a plurality of outer leads extended from the inner lead and to be connected to other circuit, and the outer leads being bent to downward from an internal end of the inner lead.

20 Claims, 3 Drawing Sheets

SEMICONDUCTOR PACKAGE AND LEAD FRAME

This application is a continuation of application Ser. No. 08/407,070 filed on Mar. 20, 1995, now abandoned.

BACKGROUND OF THE INVENTION

The present invention relates to a semiconductor package and lead frame used for the semiconductor package, and more particularly to a semiconductor package in which outer lead of lead frame are located at a middle portion of a bottom surface of the semiconductor package, so that a mounting area taken by the semiconductor chip when mounted on a printed circuit board may be minimized.

Usually a plastic semiconductor package is manufactured by a process including the steps of separating a semiconductor chip by a sawing process after a wafer fabrication process, attaching a separated chip on a paddle of a lead frame, wirebonding pads of the chip and an inner lead frame for electrically connecting the chip, and molding a predetermined space including said semiconductor chip and the inner lead of the lead frame by a resin such an epoxy molding compound.

There are a wide variety of package types of general semiconductor packages, some popular types are shown in FIG. 1(A) (B) and (C).

FIG. 1(A) shows a "J" leaded package (SOJ type), FIG. 1(B) shows a gull wing leaded package, and FIG. 1(C) shows another "J" leaded package. The package types are classified in accordance with bending form of outer leads of a lead frame which is positioned at both sides or four sides of the packaging mold.

Semiconductor packages of the SOJ type, butt-leaded package type, and gull-wing leaded package type are for surface mounting to a printed wired board (hereinafter PWB), while Dual In-line Package type, SIP, ZIP, and QUIP types of semiconductor packages are for through-hole types of semiconductor packages.

Structure of such semiconductor packages include at least one semiconductor chip 1, a chip paddle 2a supporting the semiconductor chip 1, a number of inner/outer leads 2b, 2c wire-bonded to the chip which are parts of a lead frame 2 making an electric signal transferring path toward an exterior of the semiconductor chip 1, a plurality of metal wires 3 electrically connecting a pad of the semiconductor chip 1 and a inner lead 2b of the lead frame 2 respectively, and a plastic molding compound 4 for sealing and protecting the semiconductor chip 1, inner lead 2b of the lead frame 2, and the metal wires 3.

Such a conventional semiconductor package is mounted on a PWB by soldering the outer lead 2c of the lead frame 2 positioned at both sides or four sides of the plastic package 4 a pattern of the PWB.

However, in a conventional semiconductor package as described above, since the outer lead 2c of the lead frame 2 is positioned at both sides or four sides of the plastic molding compound 4, at a time of mounting, the package should take a large mounting area, and thus there is difficulty for reducing a size, weight, thickness, etc.. Particularly in case of mounting packages successively, since they should be mounted with keeping a minimum distance between neighboring packages, the substrate should become necessarily wider. At a time of mounting, there also has been a concern of forming a bridge between the leads of the neighboring packages due to a reflow soldering technique.

OBJECT AND SUMMARY OF THE INVENTION

Therefore, it is an object of the present invention invented to provide a semiconductor package which has outer leads of lead frame, the outer leads positioned at a middle portion of a bottom surface of plastic molding compound so that the mounting area is minimized and so as to make the product to be light, thin, short and of small size.

Another object of the present invention is to provide a lead frame used for a semiconductor package of the present invention.

In order to accomplish the object of the present invention, a semiconductor package comprises at least one semiconductor chip; a lead frame having a chip paddle supporting a semiconductor chip, a plurality of inner leads wire-bonded to the chip and a plurality of outer leads extended from the inner leads; and a plastic molding compound sealing the chip and the inner leads of the lead frame, wherein the leads of the lead frame are arranged within an area of a bottom surface of the plastic molding compound.

The outer leads of the lead frame are arranged at predetermined intervals at a middle portion of a bottom surface of the plastic molding compound.

In order to attain other objects of the present invention, the lead frame for a semiconductor package includes a plurality of inner leads to be connected to the semiconductor chip and a plurality of outer leads which are outwardly bent from an internal end of the inner lead.

In accordance with the semiconductor package of the present invention, the outer leads making a signal transferring path from the chip to outside of the package of the lead frame are arranged at a middle portion of bottom surface of the plastic molding compound; thus, in the case of mounting on PWB, the connecting portion of the outer leads of the package and wires of the PWB are located inside of a portion which was taken by the package, thereby its mounting area becomes reduced. That is, in case of successively mounting a plurality of semiconductor packages, intervals between neighboring packages can be reduced, and bad contact with the neighboring package due to a soldering defect can be avoided. As a result, the PWB or PCB can be made smaller.

BRIEF DESCRIPTION OF THE DRAWINGS

The above object and other advantages of the present invention will become more apparent after describing in detail the preferred embodiment of the present invention with reference to the attached drawings in which:

FIG. 4 and FIG. 5 are respectively showing other embodiments of the present invention, in which FIG. 4 is a partly cut out perspective view showing a structure of semiconductor package of the present invention, FIG. 5 is a perspective view of a lead frame used for semiconductor package of the present invention.

DETAILED DESCRIPTION OF THE INVENTION

Hereinafter, the semiconductor package in accordance with the present invention will be described in more detail with reference to the accompanying drawings.

Figure 1A:
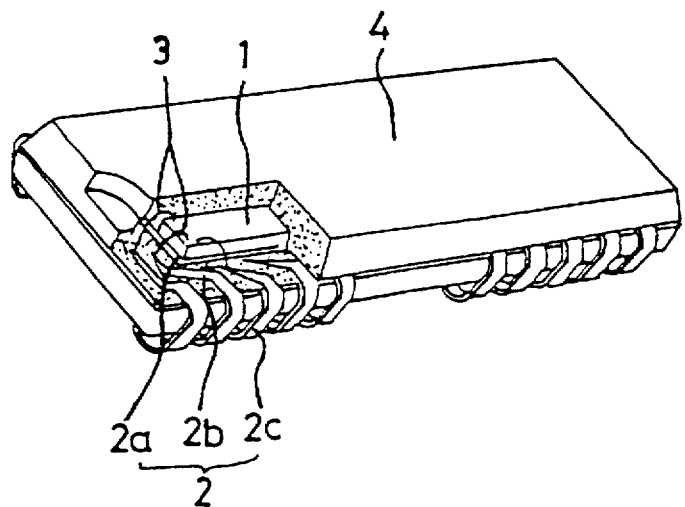
FIG. 1(A),(B) and (C) are partly cut out perspective views showing various forms conventional semiconductor packages, FIG. 2 and FIG. 3, respectively show an embodiment of the present invention, where
Figure 1B:
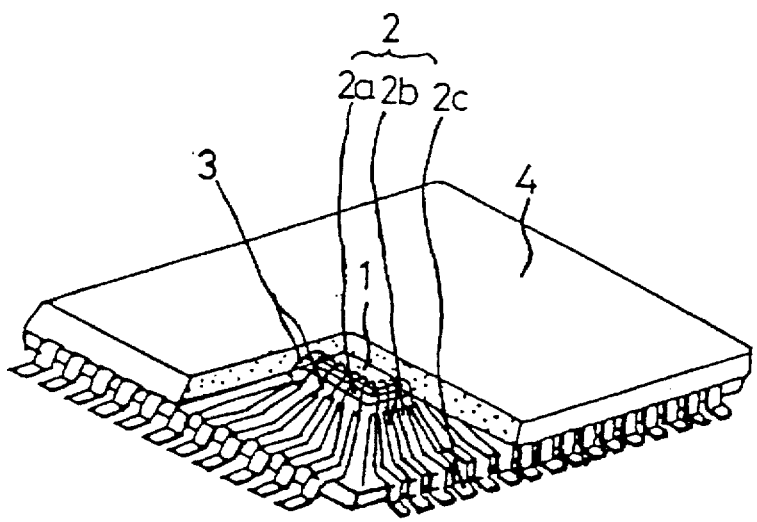
Figure 1C:
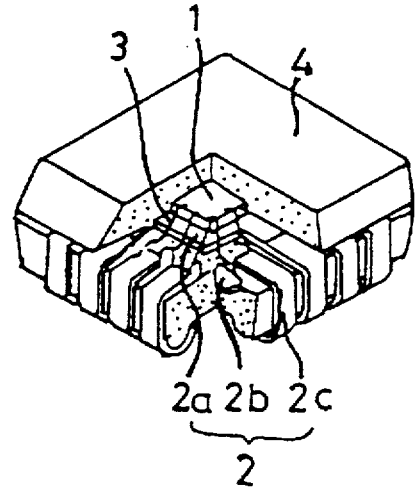
Figure 2:
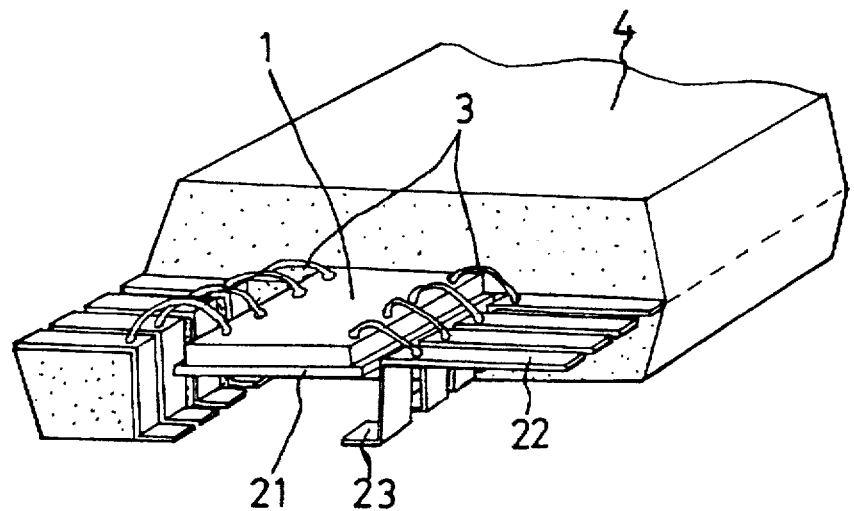
FIG. 2 is perspective view, partly cut, out showing a structure of semiconductor package of the present invention.

FIG. 2 is a perspective view showing an interior structure of semiconductor package which is partly cut out; As shown in this figure, the semiconductor package in accordance with the present invention takes a structure that outer leads 23 of the lead frame 20 are not protruded to the right and left of the plastic molding compound surrounding the chip, but they are arranged at predetermined intervals from a middle portion of a bottom surface of the semiconductor chip.

Here, the semiconductor chip 1 is attached and fixed on the chip paddle 21 of the lead frame 20, and said semiconductor chip 1 and the inner lead 22 of the lead frame 20 are electrically connected by metal wires 3. The semiconductor chip 1, the inner leads 22 of the lead frame 20 and the metal wires 3 are sealed from exterior by the plastic molding compound 4. Thus the outer leads 23 of the lead frame 20 are protruded from the plastic molding compound and arranged at a middle portion of a bottom surface of the semiconductor pasket.

Figure 3:
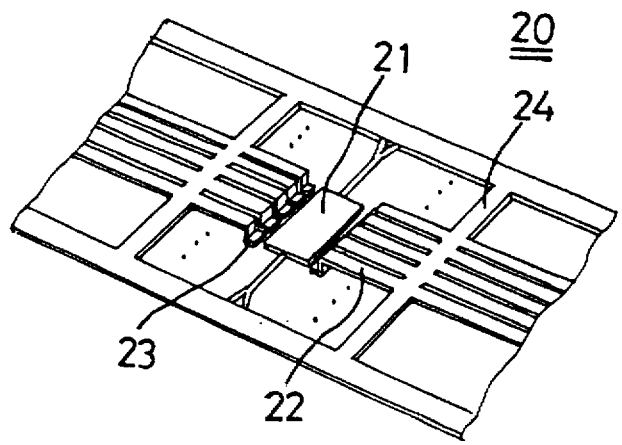
FIG. 3 is perspective view of a lead frame used for a semiconductor package of the present invention.

FIG. 3 shows a structure of the lead frame used for the semiconductor package in accordance with the present invention as described above. As shown in FIG. 3, it is structured such that a plurality of outer leads 23 to be connected to a printed wired board are bent at an inner end portion of inner leads 22 which are to be connected to the semiconductor chip 1. These outer leads are directed downward of the chip paddle 21, so that the outer leads 23 are disposed at a middle portion of a bottom surface of the plastic molding compound 4 at a time of a package molding process.

That is, the outer leads 23 make a 90 degrees angle from an inner end portion of the inner lead 22 horizontally positioned at an upper portion of the chip paddle 21, and in the drawing, the vertically descending lead from the inner lead 22 is the outer lead 23, and a dam bar 24 supports the inner lead 22.

Here, although an example is shown in which the inner leads 22 are symmetrically arranged around the chip paddle 21, this may be arranged in other forms, for example, to radially arranged around the chip paddle 21, or structured without chip paddle 21. After a die-bonding, a wire-bonding, and a molding process are carried out by utilizing the lead frame, a semiconductor package as shown in FIG. 2 can be obtained by cutting and trimming the leads protruded to an exterior of the plastic molding compound 4.

In accordance with the semiconductor package of the invention, since its outer leads 23 are exposed in the same plane at a middle portion of bottom surface of the plastic molding compound 4, this makes it possible for the package to be surface-mounting. In case of surface mounting, a space for connecting between the outer leads and the metal lines of in PWB is not needed, unlike to the conventional gull-wing leaded package type. Accordingly a reduction of space for lead connections is made possible.

As described above, in accordance with the semiconductor package according to the present invention, since the outer leads of the lead frame making a signal transferring path toward the exterior of the chip are arranged at a middle portion of a bottom surface of the plastic molding compound, the connecting portion of the outer leads of the package, and the metal lines of the PCB, can be included totally within a package area. That is, in case of successively mounting a plurality of semiconductor packages, intervals between the neighboring packages can be reduced, and contact with neighboring a package due to bad soldering can be avoided.

Figure 4:
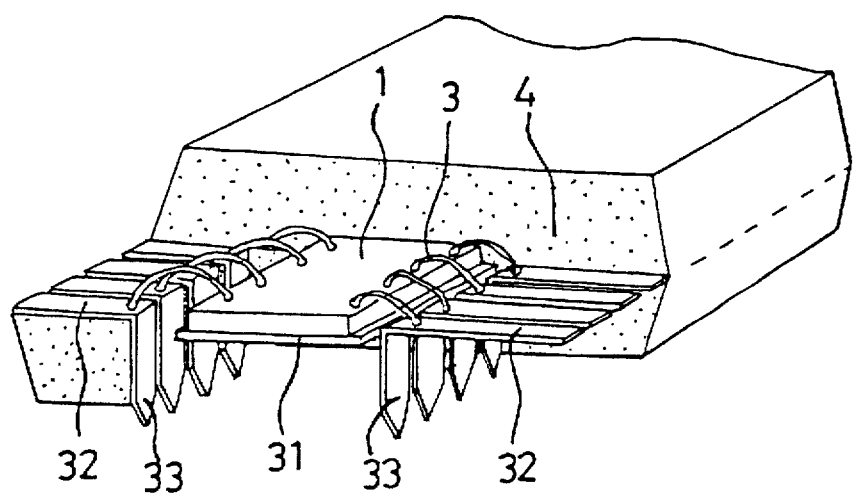
Figure 5:
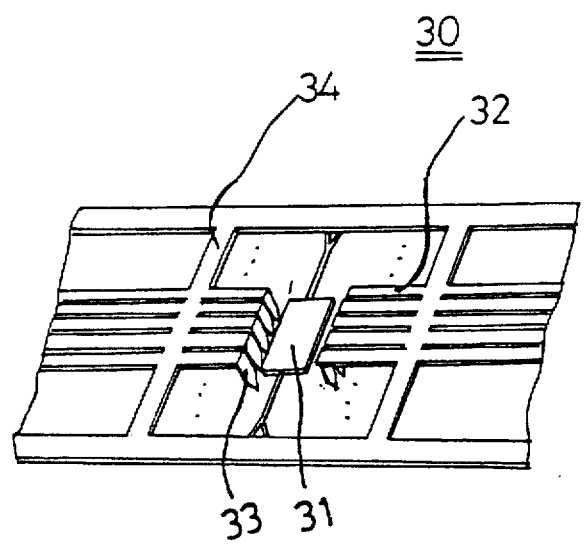

FIG. 4 and FIG. 5 are for explanation of another embodiment of the present invention, which respectively show view of a partly cut out package and the lead frame, respectively, used for this package.

As shown in the figures, for the semiconductor package according to this embodiment, the outer leads 33 are arranged at a middle portion of a bottom surface of the plastic molding compound 4 which seals and protects the semiconductor chip 1. The inner leads 32 of the lead frame 30 as well as the metal wires 3 are not made to be of a surface mounting form, as in the above described first embodiment. Instead, the outer leads are formed to protrude from a molding compound surface so as to be able to be mounted on a through hole type package. The structure of the outer lead 33 of the lead frame is not bent twice, and it is formed with only one bend perpendicularly to the inner lead 32.

The other structure of package and lead frame of this embodiment is similar to the first embodiment.

As described above, in accordance with the semiconductor package according to this embodiment, since the outer leads of the lead frame are also arranged within an area of bottom portion of the plastic molding compound, the connecting portion of the outer lead of the package and the metal lines of the PCB can be also included within the package area. That is, in case of successively mounting a plurality of semiconductor packages, intervals between the neighboring packages can be reduced, and contact with a neighboring package due to a soldering defect can be avoided.

What is claimed is:

1. A semiconductor package comprising:
   a semiconductor chip;
   a lead frame having a chip paddle for supporting the semiconductor chip and a plurality of leads, each lead having an inner portion wire-bonded to the semiconductor chip and an outer portion for connecting the semiconductor chip to elements external of the semiconductor chip; and
   a molding compound having a bottom surface, said molding compound encompassing and sealing the semiconductor chip and the inner portion of each of the leads but not encompassing the outer portion of each of the leads;
   wherein each of the leads includes a first bend and a second bend so that the outer portion of each of the leads extends substantially parallel to the semiconductor chip, said outer portion of each of the leads being exposed on, but not projecting from, a middle portion of the bottom surface of the molding compound.

2. A lead frame for use in a semiconductor package, the lead frame comprising:
   a frame having side members connected by dam bars to form four sides;
   a chip paddle for supporting a chip thereon, said chip paddle being supported by supports affixed to said side members; and
   a plurality of leads extending substantially horizontally toward said chip paddle from each of said dam bars, each of said plurality of leads having a first bend to direct downwardly and away from the chip paddle said leads horizontally extending from the dam bars, and a second bend to direct substantially horizontally and toward the chip paddle said leads downwardly extending from the first bend, a portion of each lead after the second bend ending without being curved.

3. The lead frame as claimed in claim 2, wherein when a molding compound encapsulates the chip, an ending portion of each lead is exposed on, but does not project from, a middle portion of the bottom surface of the molding compound.

4. The semiconductor package as claimed in claim 1, wherein the outer surface of said outer portion of each lead which extends substantially parallel to the semiconductor chip is flush with the middle portion of the bottom surface of the molding compound.

5. The semiconductor package as claimed in claim 4, wherein the first bend and the second bend are adjacent to each other and each form approximately a 90° angle.

6. The semiconductor package as claimed in claim 4, wherein the molding compound is a plastic molding compound.

7. The lead frame of claim 2, wherein when a molding compound encapsulates the chip, the outer surface of an end portion of each lead adjacent the second bend is flush with the bottom surface of the molding compound.

8. The semiconductor package as claimed in claim 5, wherein the outer portions of the leads line up along the middle portion of the bottom surface of the molding compound.

9. The semiconductor package as claimed in claim 8, wherein the outer portions of the leads form exactly two lines along the middle portion of the bottom surface of the molding compound.

10. The semiconductor package as claimed in claim 8, wherein the outer portions of the leads end at the middle portion of the bottom surface of the molding compound without being curved.

11. The semiconductor package as claimed in claim 1, wherein the inner portion of each of the leads is bent by the first bend and directly connected to the outer portion of each of the leads at the second bend, so that each of the leads has first through third parts which are contained in three different planes.

12. The semiconductor package as claimed in claim 11, wherein the first and second parts are directly connected to each other at the first bend, and the second and third parts are directly connected to each other at the second bend.

13. The lead frame of claim 2, wherein each of the leads includes first through third parts which are contained in three different planes.

14. The lead frame of claim 13, wherein the first and second parts are directly connected to each other at the first bend, and the second and third parts are directly connected to each other at the second bend.

15. The lead frame of claim 7, wherein when the molding compound encapsulates the chip, the ending portion of each lead is exposed on, but does not project from, a middle portion of the bottom surface of the molding compound.

16. The lead frame of claim 15, wherein when the molding compound encapsulates the chip, said leads near the second bends line up along the middle portion of the bottom surface of the molding compound.

17. The lead frame of claim 16, wherein said leads near the second bends form exactly two lines along the middle portion of the bottom surface of the molding compound.

18. The lead frame of claim 2, wherein the first bend and the second bend are adjacent to each other and each form approximately a 90° angle.

19. The semiconductor package of claim 1, wherein the entire leads do not project out from the molding compound.

20. The lead frame of claim 13, wherein the first bend and the second bend are adjacent to each other and each form approximately a 90° angle.

* * * * *